(12) United States Patent
Jung

(10) Patent No.: US 9,568,941 B2
(45) Date of Patent: Feb. 14, 2017

(54) MEMORY CONTROLLER, MEMORY SYSTEM INCLUDING THE SAME AND METHOD OF OPERATING MEMORY CONTROLLER

(71) Applicant: SAMSUNG ELECTRONICS CO., LTD., Suwon-si (KR)

(72) Inventor: Jin-Su Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 96 days.

(21) Appl. No.: 14/589,660

(22) Filed: Jan. 5, 2015

(65) Prior Publication Data

US 2015/0261250 A1 Sep. 17, 2015

(30) Foreign Application Priority Data

Mar. 11, 2014 (KR) .................. 10-2014-0028099

(51) Int. Cl.
| | |
|---|---|
| *G06F 1/00* | (2006.01) |
| *G06F 1/08* | (2006.01) |
| *G06F 13/42* | (2006.01) |
| *G06F 1/32* | (2006.01) |
| *G11C 7/22* | (2006.01) |
| *G06F 1/10* | (2006.01) |
| *G06F 1/04* | (2006.01) |

(52) U.S. Cl.
CPC .............. *G06F 1/08* (2013.01); *G06F 13/4234* (2013.01); *G06F 1/04* (2013.01); *G06F 1/10* (2013.01); *G06F 1/3225* (2013.01); *G11C 7/222* (2013.01); *Y02B 60/1217* (2013.01); *Y02B 60/1228* (2013.01); *Y02B 60/1235* (2013.01)

(58) Field of Classification Search
CPC ............ G06F 1/3225; G06F 1/08; G06F 1/10; G06F 13/4234; G06F 1/04; G11C 7/222; Y02B 60/1217
See application file for complete search history.

(56) References Cited

U.S. PATENT DOCUMENTS

| | | | |
|---|---|---|---|
| 6,112,310 A | 8/2000 | Jun et al. | |
| 6,263,448 B1 * | 7/2001 | Tsern .................... | G06F 1/3225 713/501 |
| 6,460,125 B2 | 10/2002 | Lee et al. | |
| (Continued) | | | |

FOREIGN PATENT DOCUMENTS

| | | |
|---|---|---|
| JP | 2006-99569 A | 4/2006 |
| JP | 2007-241785 A | 9/2007 |

*Primary Examiner* — Xuxing Chen
(74) *Attorney, Agent, or Firm* — Sughrue Mion, PLLC

(57) ABSTRACT

A memory controller includes a clock scaler, a bus component and a level monitor. The clock scaler is configured to receive a first clock signal and configured to generate a second clock signal based on the first clock signal, first and second frequency control signals. A frequency of the second clock signal may increase based on the first frequency control signal and decrease based on the second frequency control signal. The bus component may operate based on the second clock signal and generate a level signal corresponding to a current operating state of the bus component. The level monitor may generate the first and second frequency control signals based on the level signal, a first threshold value, a second threshold value, a first reference time, and a second reference time.

20 Claims, 11 Drawing Sheets

(56) References Cited

U.S. PATENT DOCUMENTS

| | | | |
|---|---|---|---|
| 6,820,209 B1 * | 11/2004 | Culbert | G06F 1/3203 713/501 |
| 7,606,960 B2 | 10/2009 | Munguia | |
| 7,840,823 B2 | 11/2010 | Kuwahara | |
| 8,438,410 B2 | 5/2013 | David et al. | |
| 2007/0083701 A1 * | 4/2007 | Kapil | G06F 1/3203 713/320 |
| 2009/0055669 A1 | 2/2009 | Pang et al. | |
| 2009/0132847 A1 | 5/2009 | Suzuki | |
| 2013/0097443 A1 | 4/2013 | Li et al. | |
| 2013/0205149 A1 | 8/2013 | Chen | |

* cited by examiner

MEMORY CONTROLLER, MEMORY SYSTEM INCLUDING THE SAME AND METHOD OF OPERATING MEMORY CONTROLLER

CROSS-REFERENCE TO RELATED APPLICATION

This application claims priority under 35 USC §119 to Korean Patent Application No. 2014-0028099, filed on Mar. 11, 2014 in the Korean Intellectual Property Office (KIPO), the contents of which are incorporated herein by reference in their entirety.

BACKGROUND

1. Technical Field

Example embodiments relate generally to semiconductor devices, and more particularly to memory controllers, memory systems including the memory controllers and methods of operating memory controllers.

2. Description of the Related Art

Recently, a large number of components are integrated into one semiconductor device, and operation speed of the semiconductor device is gradually increased. Thus, reduction of power consumption in the semiconductor device is required. Many semiconductor devices employ a dynamic voltage and frequency scaling (DVFS) scheme that predicts an operating state of a semiconductor device and dynamically changes an operating frequency and an operating voltage of the semiconductor device based on the predicted operating state.

SUMMARY

Accordingly, the present disclosure is provided to reduce power consumption in semiconductor devices.

Some exemplary embodiments provide a memory controller that may generate a clock signal capable of efficiently controlling a frequency.

Some exemplary embodiments provide a memory system including the memory controller.

Some exemplary embodiments provide a method of operating the memory controller.

According to an exemplary embodiment, a memory controller includes a clock scaler, a bus component and a level monitor. The clock scaler is configured to receive a first clock signal, a first frequency control signal, and a second frequency control signal. The clock scaler is configured to generate a second clock signal based on the first clock signal, the first frequency control signal, and the second frequency control signal. A frequency of the second clock signal increases based on the first frequency control signal. The frequency of the second clock signal decreases based on the second frequency control signal. The bus component is configured to operate based on the second clock signal, and is configured to generate a level signal corresponding to a current operating state of the bus component. The level monitor is configured to generate the first frequency control signal and the second frequency control signal based on the level signal, a first threshold value, a second threshold value, a first reference time, and a second reference time.

The frequency of the second clock signal may be controlled based on a feedback operation and an aging operation. The feedback operation may indicate that the frequency of the second clock signal is changed by determining the current operating state of the bus component based on the level signal. The aging operation may indicate that the frequency of the second clock signal is changed after the first reference time or the second reference time has elapsed.

The level monitor may include a comparator and at least one controller. The comparator may generate a first comparison signal by comparing the level signal with the first threshold value, and may generate a second comparison signal by comparing the level signal with the second threshold value. The at least one controller may selectively activate the first frequency control signal based on the first comparison signal and the first reference time. The at least one controller may selectively activate the second frequency control signal based on the second comparison signal and the second reference time.

The comparator may activate the first comparison signal when a value of the level signal is greater than the first threshold value, and may activate the second comparison signal when the value of the level signal is smaller than the second threshold value.

The at least one controller may activate the first frequency control signal when a first activation time is longer than the first reference time. The first activation time may indicate a time during which the first comparison signal is activated.

The at least one controller may include a timer. The timer may measure the first activation time.

The at least one controller may activate the second frequency control signal when a second activation time is longer than the second reference time. The second activation time may indicate a time during which the second comparison signal is activated.

The level monitor may further include a storage. The storage may store the first threshold value, the second threshold value, the first reference time and the second reference time.

The bus component may include at least one request buffer. The level signal may have a value corresponding to an amount of requests that are currently received by at least one request buffer.

The bus component may include at least one data buffer. The level signal may have a value corresponding to an amount of data that are currently received by at least one data buffer.

At least one from among the first threshold value, the second threshold value, the first reference time and the second reference time may be variable.

At least one from among the first threshold value, the second threshold value, the first reference time and the second reference time may be determined based on a user input signal.

At least one from among the first threshold value, the second threshold value, the first reference time and the second reference time may be adaptively changed based on a training operation.

The memory controller may be a direct memory access (DMA) controller.

According to exemplary embodiment, a memory system may include at least one memory device and a memory controller. At least one memory device is configured to store data or output stored data. The memory controller is configured to control an operation of at least one memory device. The memory controller is configured to include a clock scaler, a bus component and a level monitor. The clock scaler is configured to receive a first clock signal, a first frequency control signal, and a second frequency control signal. The clock scaler is configured to generate a second clock signal based on the first clock signal, the first frequency control signal, and the second frequency control signal. A frequency of the second clock signal is configured to increase based on the first frequency control signal. The frequency of the second clock signal may decrease based on the second frequency control signal. The bus component is configured to operate based on the second clock signal, and is configured to generate a level signal corresponding to a current operating state of the bus component. The level monitor is configured to generate the first frequency control signal and the second frequency control signal based on the level signal, a first threshold value, a second threshold value, a first reference time, and a second reference time.

According to exemplary embodiment, in a method of operating a memory controller, a first clock signal is received. A second clock signal having an initial frequency is generated based on the first clock signal. A bus component included in the memory controller is operated based on the second clock signal. A first frequency control signal and a second frequency control signal are generated based on a level signal, a first threshold value, a second threshold value, a first reference time, and a second reference time. The level signal corresponds to a current operating state of the bus component. A frequency of the second clock signal is changed based on the first frequency control signal and the second frequency control signal.

In generating the first and second frequency control signals, a first comparison signal may be generated by comparing the level signal with the first threshold value. A second comparison signal may be generated by comparing the level signal with the second threshold value. The first frequency control signal may be selectively activated based on the first comparison signal and the first reference time. The second frequency control signal may be selectively activated based on the second comparison signal and the second reference time.

The first comparison signal may be activated when a value of the level signal is greater than the first threshold value. The second comparison signal may be activated when the value of the level signal is smaller than the second threshold value.

The first frequency control signal may be activated when a first activation time is longer than the first reference time. The second frequency control signal may be activated when a second activation time is longer than the second reference time. The first activation time may indicate a time during which the first comparison signal is activated. The second activation time may indicate a time during which the second comparison signal is activated.

The frequency of the second clock signal may increase when the first frequency control signal is activated. The frequency of the second clock signal may decrease when the second frequency control signal is activated.

Accordingly, the memory controller according to exemplary embodiments may operate based on an auto frequency scaling (AFS) scheme and may include the level monitor for self-checking traffics of the memory controller in an intellectual property (IP) level. In addition, the memory controller may efficiently control the frequency of the second clock signal by a feedback operation performed based on the level signal and the threshold values, and by an aging operation performed based on the reference times. Thus, the second clock signal may have an optimized frequency corresponding to the current operating state of the memory controller, and the memory controller may have relatively low power consumption.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION

Figure 1:
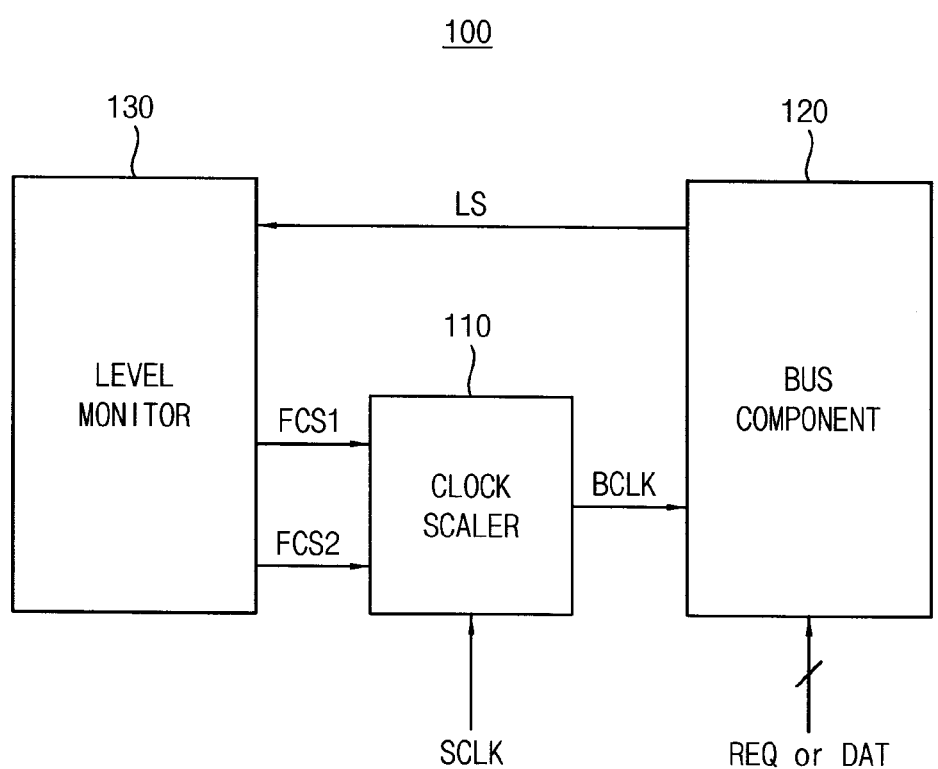
FIG. 1 is a block diagram illustrating a memory controller according to exemplary embodiments.

Various exemplary embodiments will be described more fully with reference to the accompanying drawings, in which exemplary embodiments are shown. The present disclosure may, however, be embodied in many different forms and should not be construed as limited to the exemplary embodiments set forth herein. Rather, these exemplary embodiments are provided so that this disclosure will be thorough and complete, and will fully convey the scope of the present disclosure to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more additional features.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory controller according to exemplary embodiments.

Referring to FIG. 1, a memory controller 100 may include a clock scaler 110, a bus component 120 and a level monitor 130.

The clock scaler 110 may receive a first clock signal SCLK, a first frequency control signal FCS1, and a second frequency control signal FCS2. The clock scaler 110 may generate a second clock signal BCLK based on the first clock signal SCLK, the first frequency control signal FCS1, and the second frequency control signal FCS2. For example, the clock scaler 110 may generate the second clock signal BCLK having an initial frequency by scaling the first clock signal SCLK, and may change a frequency of the second clock signal BCLK based on the first and second frequency control signals FCS1 and FCS2, respectively. The frequency of the second clock signal BCLK may increase based on the first frequency control signal FCS1, and the frequency of the second clock signal BCLK may decrease based on the second frequency control signal FCS2.

The first clock signal SCLK may be a system clock signal that is provided from outside of the memory controller 100 (e.g., from a processor). Although FIG. 1 illustrates that the clock scaler 110 generates the second clock signal BCLK based on one clock signal SCLK (e.g., by scaling one clock signal SCLK), according to exemplary embodiments, the clock scaler 110 may generate the second clock signal BCLK by scaling a plurality of clock signals.

The bus component 120 may operate based on the second clock signal BCLK. The bus component 120 may generate a level signal LS corresponding to a current operating state of the bus component 120. The second clock signal BCLK may be a bus clock signal for driving the bus component 120. For example, the bus component 120 may receive, handle, or process requests REQ and/or data DAT based on the second clock signal BCLK. The requests REQ and/or the data DAT may be provided from the outside of the memory controller 100 (e.g., from the processor). The level signal LS may have a value that corresponds to a capacity of the bus component 120 for receiving, handling, or processing the requests REQ and/or the data DAT in real time. As will be described below with reference to FIGS. 5A and 5B, the bus component 120 may include a request buffer storing the requests REQ and/or a data buffer storing the data DAT.

The level monitor 130 may generate the first frequency control signal FCS1 and the second frequency control signal FCS2 based on the level signal LS, a first threshold value, a second threshold value, a first reference time, and a second reference time. For example, the level monitor 130 may selectively activate one of the first and second frequency control signals FCS1 and FCS2, respectively, based on the first and second reference times and on a result of comparing the level signal LS with the first and second threshold values. If the bus component 120 includes the request buffer and/or the data buffer, the level monitor 130 may be a buffer level monitor that monitors a capacity of the request buffer and/or a capacity of the data buffer in real time. Detailed configuration and operation of the level monitor 130 will be described below with reference to FIGS. 2 and 4.

In some exemplary embodiments, the memory controller 100 may control the frequency of the second clock signal BCLK based on a feedback operation and an aging operation. The feedback operation may indicate that the frequency of the second clock signal BCLK is changed by determining the current operating state of the bus component 120 based on the level signal LS. The aging operation may indicate that after the first reference time has elapsed, the frequency of the second clock signal BCLK is changed if a determination result complies with a predetermined condition. Also, the aging operation may indicate that after the second reference time has elapsed, the frequency of the second clock signal BCLK is changed if the determination result complies with the predetermined condition.

In some exemplary embodiments, the memory controller 100 may be a direct memory access (DMA) controller such that a memory device (not illustrated) controlled by the memory controller 100 can be directly accessed by peripheral devices (not illustrated). In other exemplary embodiments, the memory controller 100 may be a normal memory controller such that the memory device controlled by the memory controller 100 can be accessed by the peripheral devices via a processor (not illustrated).

The memory controller 100 according to exemplary embodiments may operate based on an auto frequency scaling (AFS) scheme. For example, a processor may not check traffics of the memory controller 100 in a system level. Instead, the memory controller 100 may self-check the traffics of the memory controller 100 at an intellectual property (IP) level, and thus the memory controller 100 may include the level monitor 130 for self-checking the traffics of the memory controller 100 at the IP level. To generate the second clock signal BCLK having an optimized frequency, the memory controller 100 may efficiently control the frequency of the second clock signal BCLK based on the a current operating state of the memory controller 100.

Figure 2:
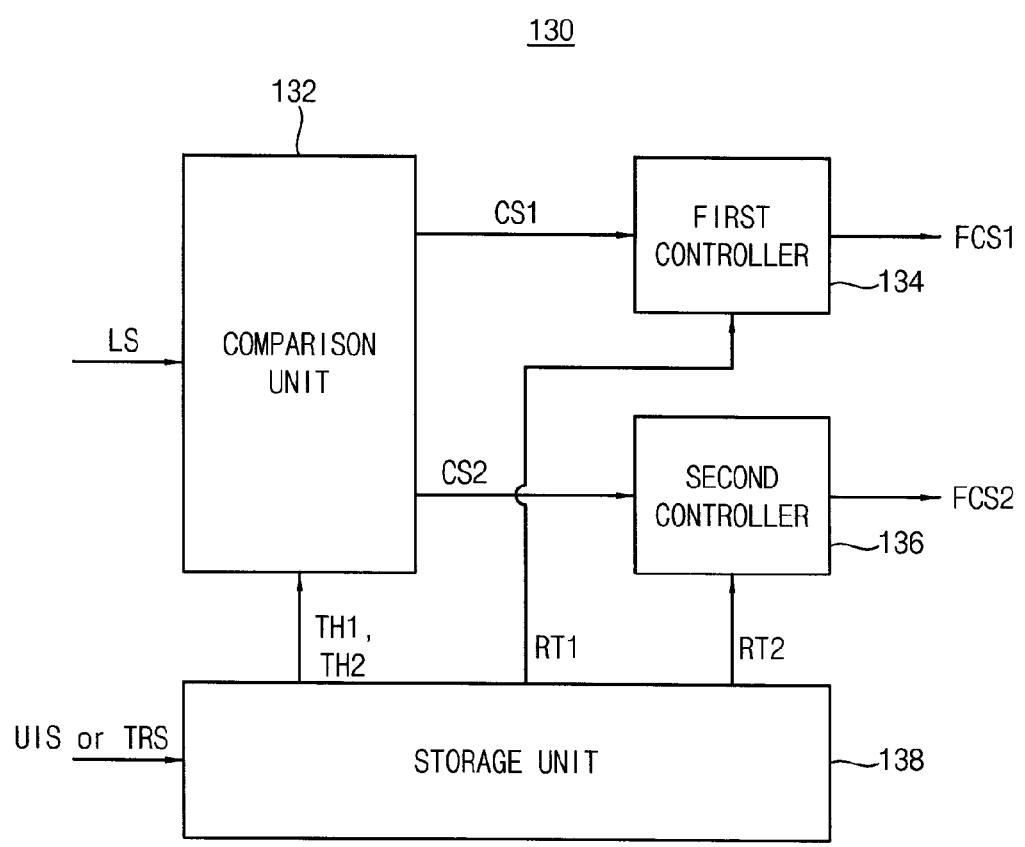
FIG. 2 is a block diagram illustrating an example of a level monitor included in the memory controller of FIG. 1.

FIG. 2 is a block diagram illustrating an example of a level monitor included in the memory controller of FIG. 1.

Referring to FIG. 2, the level monitor 130 may include a comparison unit (i.e., comparator) 132, a first control unit (i.e., first controller) 134 and a second control unit (i.e., second controller) 136. The level monitor 130 may further include a storage 138.

The comparison unit 132 may generate a first comparison signal CS1 by comparing the level signal LS with the first threshold value TH1, and may generate a second comparison signal CS2 by comparing the level signal LS with the second threshold value TH2. For example, the comparison unit 132 may activate the first comparison signal CS1 when a value of the level signal LS is greater than the first threshold value TH1, and may activate the second comparison signal CS2 when the value of the level signal LS is smaller than the second threshold value TH2. The first threshold value TH1 may be an upper threshold value that corresponds to a maximum capacity of the bus component 120 for receiving, handling, or processing the requests REQ and/or the data DAT. The second threshold value TH2 may be a lower threshold value that corresponds to a minimum capacity of the bus component 120 for receiving, handling, or processing the requests REQ and/or the data DAT.

The first control unit 134 may selectively activate the first frequency control signal FCS1 based on the first comparison signal CS1 and the first reference time RT1. For example, the first control unit 134 may activate the first frequency control signal FCS1 when a first activation time is longer than the first reference time RT1. The first activation time may indicate a time during which the first comparison signal CS1 is activated. For example, assuming that the first reference time RT1 corresponds to 100 clock cycles, where one clock cycle is substantially the same as one period of the second clock signal BCLK, the first frequency control signal FCS1 may be activated when the first comparison signal CS1 is activated during more than 100 clock cycles (e.g., when the value of the level signal LS is greater than the first threshold value TH1 during more than 100 clock cycles).

In some exemplary embodiments, the first control unit 134 may include a first timer that measures the first activation time. For example, assuming that the first reference time RT1 corresponds to 100 clock cycles, the first timer may start to operate at a time point at which the first comparison signal CS1 is activated. After the first timer starts to operate, an operation of the first timer may be completed when more than 100 clock cycles has elapsed. The first frequency control signal FCS1 may be activated when the operation of the first timer is completed. If, after the first timer starts to operate, the first frequency control signal FCS1 is deactivated before 100 clock cycles has elapsed, the first timer may stop operating and may be reset.

In other exemplary embodiments, the first control unit 134 may include a first counter that measures the first activation time by counting the number of the clock cycles.

The second control unit 136 may selectively activate the second frequency control signal FCS2 based on the second comparison signal CS2 and the second reference time RT2. For example, the second control unit 136 may activate the second frequency control signal FCS2 when a second activation time is longer than the second reference time RT2. The second activation time may indicate a time during which the second comparison signal CS2 is activated. According to exemplary embodiments, the second reference time RT2 may be substantially the same as the first reference time RT1 or may be different from the first reference time RT1.

In some exemplary embodiments, the second control unit 136 may include a second timer that measures the second activation time. In other exemplary embodiments, the second control unit 136 may include a second counter that measures the second activation time by counting the number of the clock cycles.

The storage 138 may store the first threshold value TH1, the second threshold value TH2, the first reference time RT1, and the second reference time RT2. For example, the storage 138 may be implemented using at least one volatile memory, e.g., a dynamic random access memory (DRAM), a static random access memory (SRAM), a mobile DRAM, etc., or may be implemented using at least one nonvolatile memory, e.g., an electrically erasable programmable read-only memory (EEPROM), a flash memory, a phase random access memory (PRAM), a ferroelectric random access memory (FRAM), a resistive random access memory (RRAM), a magnetic random access memory (MRAM), a nano floating gate memory (NFGM), a polymer random access memory (PoRAM), etc.

In some exemplary embodiments, at least one of the first threshold value TH1, the second threshold value TH2, the first reference time RT1, and the second reference time RT2 may be variable. The first threshold value TH1, the second threshold value TH2, the first reference time RT1 and the second reference time RT2 may be stored in the storage 138 in a form of a lookup table. For example, the storage 138 may receive an user input signal UIS having an user setting value. At least one of the first threshold value TH1, the second threshold value TH2, the first reference time RT1, and the second reference time RT2 may be determined based on the user input signal UIS. According to another exemplary embodiment, the storage 138 may receive a training signal TRS that corresponds to a result of a training operation of a system including the memory controller 100 of FIG. 1. At least one of the first threshold value TH1, the second threshold value TH2, the first reference time RT1, and the second reference time RT2 may be adaptively changed based on the training operation, e.g., based on the training signal TRS.

In other exemplary embodiments, all of the first threshold value TH1, the second threshold value TH2, the first reference time RT1, and the second reference time RT2 may be fixed.

In some exemplary embodiments, at least a portion of the comparison unit 132, the first control unit 134, and the second control unit 136 in the level monitor 130 may be implemented as software or in a form of program codes that are executed by the processor. In other exemplary embodiments, at least a portion of the comparison unit 132, the first control unit 134, and the second control unit 136 in the level monitor 130 may be implemented as hardware.

Although FIG. 2 illustrates that the storage 138 is included in the level monitor 130, according to exemplary embodiments, the storage 138 may be located outside of the level monitor 130 or may be located outside of the memory controller 100 in FIG. 1.

Figure 3:
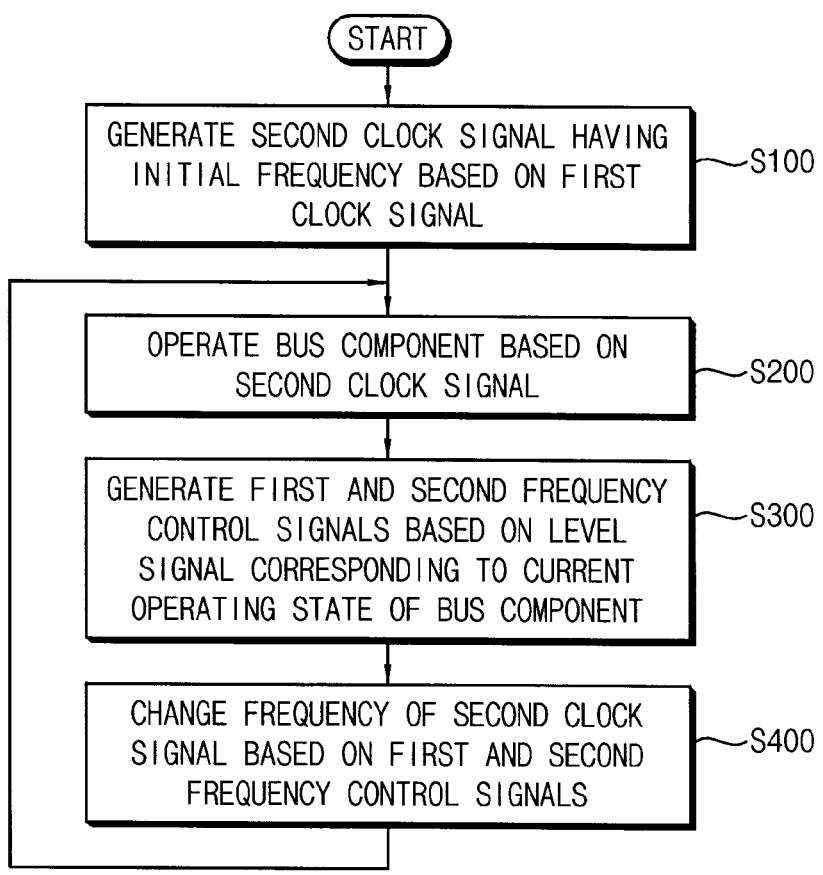
FIG. 3 is a flow chart illustrating a method of operating the memory controller of FIG. 1.
Figure 4:
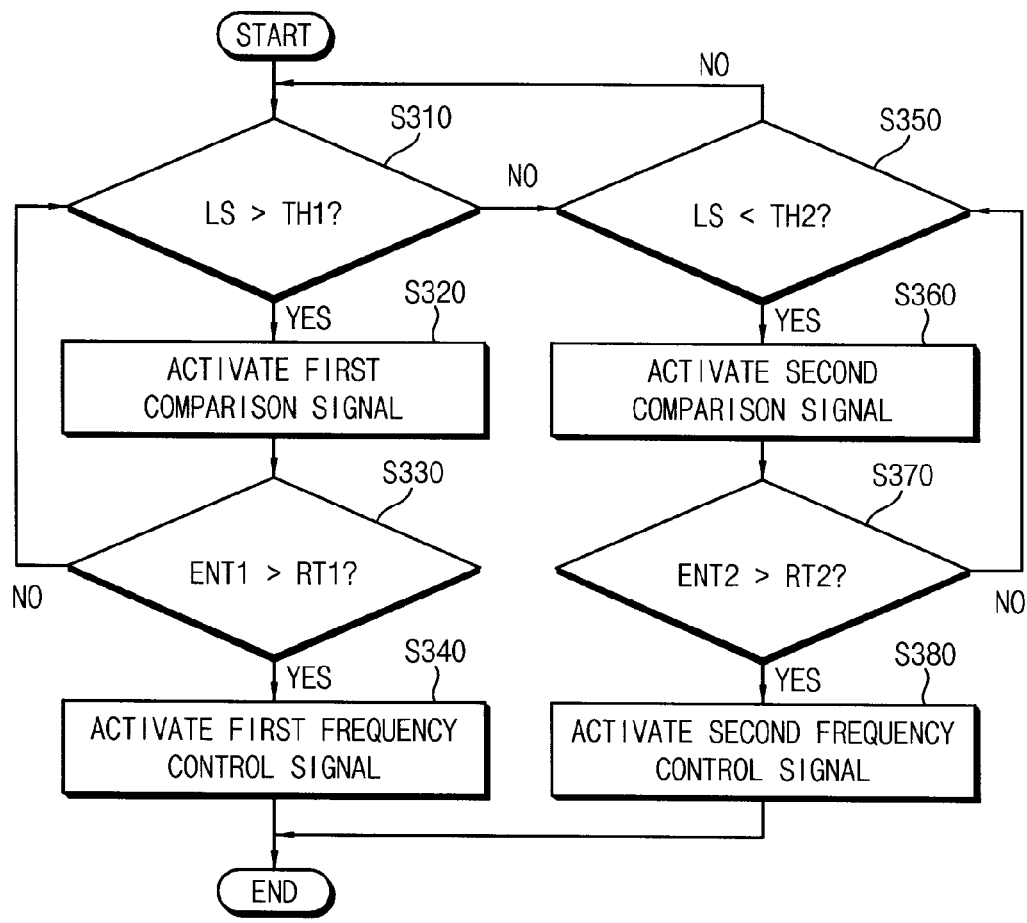
FIG. 4 is a flow chart illustrating an exemplary embodiment of step S300 in FIG. 3.

FIG. 3 is a flow chart illustrating a method of operating the memory controller in FIG. 1. FIG. 4 is a flow chart illustrating an exemplary embodiment of step S300 in FIG. 3.

Referring to FIGS. 1 and 3, the first clock signal SCLK is received, and the second clock signal BCLK having the initial frequency may be generated based on the first clock signal SCLK (step S100). For example, the clock scaler 110 may generate the second clock signal BCLK having the initial frequency by scaling the first clock signal SCLK.

The bus component 120 may be operated based on the second clock signal BCLK (step S200). For example, the bus component 120 may receive, handle or process the requests REQ and/or the data DAT based on the second clock signal BCLK.

The first frequency control signal FCS1 and the second frequency control signal FCS2 may be generated based on the level signal LS, the first threshold value, the second threshold value, the first reference time and the second reference time (step S300). The level signal LS may correspond to the current operating state of the bus component 120. For example, the level monitor 130 may selectively activate one of the first and second frequency control signals FCS1 and FCS2, respectively, based on the first and second reference times and on a result of comparing the level signal LS with the first and second threshold values.

The frequency of the second clock signal BCLK may be changed based on the first frequency control signal FCS1 and the second frequency control signal FCS2 (step S400). For example, the clock scaler 110 may increase the frequency of the second clock signal BCLK when the first frequency control signal FCS1 is activated, and may decrease the frequency of the second clock signal BCLK when the second frequency control signal FCS2 is activated. The frequency of the second clock signal BCLK may be maintained when both the first and second frequency control signals FCS1 and FCS2 are deactivated.

The steps S200, S300, and S400 may be repeated based on the second clock signal BCLK having the changed or maintained frequency. The method of operating the memory controller 100 illustrated in FIG. 3 may be repeatedly performed while the memory controller 100 operates normally (e.g., while a power supply voltage is supplied to the memory controller 100, and the requests REQ and/or the data DAT are received, handled, or processed by the memory controller 100 based on the second clock signal BCLK).

Referring to FIGS. 2 and 4, in the step S300, a first comparison operation may be performed by comparing the level signal LS with the first threshold value TH1 (step S310). A second comparison operation may be performed by comparing the level signal LS with the second threshold value TH2 (step S350). For example, the comparison unit 132 may perform the first and second comparison operations. When a value of the level signal LS is between the first threshold value TH1 and the second threshold value TH2, e.g., when the value of the level signal LS is smaller than or equal to the first threshold value TH1 (step S310: NO) and is greater than or equal to the second threshold value TH2 (step S350: NO), the first and second comparison operations may be repeated by the comparison unit 132.

When the value of the level signal LS is greater than the first threshold value TH1 (step S310: YES), the first comparison signal CS1 may be activated (step S320). For example, the comparison unit 132 may activate the first comparison signal CS1.

After the first comparison signal CS1 is activated, a third comparison operation may be performed by comparing a first activation time ENT1 with the first reference time RT1 (step S330). The first activation time ENT1 may indicate a time during which the first comparison signal CS1 is activated. For example, the first control unit 134 may perform the third comparison operation based on the first timer or the first counter during the first activation time ENT1.

When the first activation time ENT1 is shorter than or equal to the first reference time RT1 (step S330: NO), the first comparison signal CS1 may be deactivated, and then the first and second comparison operations may be repeated by the comparison unit 132. When the first activation time ENT1 is longer than the first reference time RT1 (step S330: YES), the first frequency control signal FCS1 may be activated (step S340). For example, the first control unit 134 may activate the first frequency control signal FCS1. In this case, the frequency of the second clock signal BCLK may increase based on the activated first frequency control signal FCS1 in the step S400 in FIG. 3.

When the value of the level signal LS is smaller than the second threshold value TH2 (step S350: YES), the second comparison signal CS2 may be activated (step S360). For example, the comparison unit 132 may activate the second comparison signal CS2.

After the second comparison signal CS2 is activated, a fourth comparison operation may be performed by comparing a second activation time ENT2 with the second reference time RT2 (step S370). The second activation time ENT2 may indicate a time during which the second comparison signal CS2 is activated. For example, the second control unit 136 may perform the fourth comparison operation based on the second timer or the second counter.

When the second activation time ENT2 is shorter than or equal to the second reference time RT2 (step S370: NO), the second comparison signal CS2 may be deactivated, and then the first and second comparison operations may be repeated by the comparison unit 132. When the second activation time ENT2 is longer than the second reference time RT2 (step S370: YES), the second frequency control signal FCS2 may be activated (step S380). For example, the second control unit 136 may activate the second frequency control signal FCS2. In this case, the frequency of the second clock signal BCLK may decrease based on the activated second frequency control signal FCS2 in the step S400 in FIG. 3.

As described above with reference to FIGS. 1-4, the memory controller 100 may efficiently control the frequency of the second clock signal BCLK by the feedback operation that is performed based on the level signal LS and the threshold values TH1 and TH2, and by the aging operation that is performed based on the reference times RT1 and RT2. Accordingly, the second clock signal BCLK may have the optimized frequency corresponding to the current operating state of the memory controller 100, and the memory controller 100 may have relatively low power consumption.

Figure 5A:
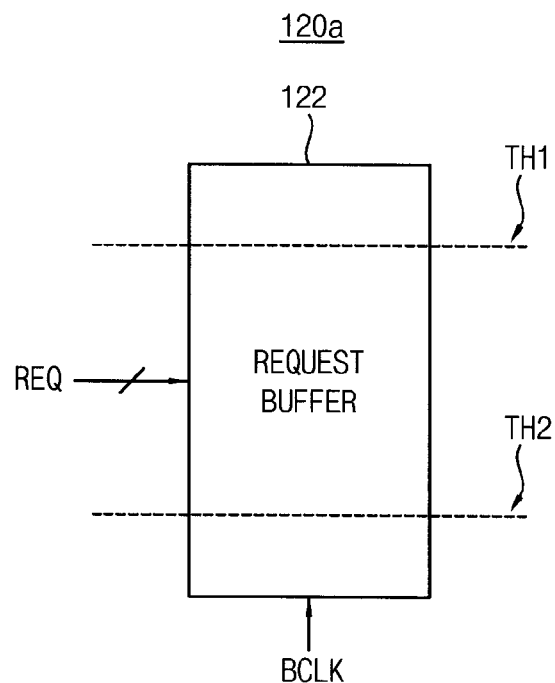
FIGS. 5A and 5B are block diagrams illustrating an exemplary embodiment of a bus component included in the memory controller of FIG. 1.
Figure 5B:
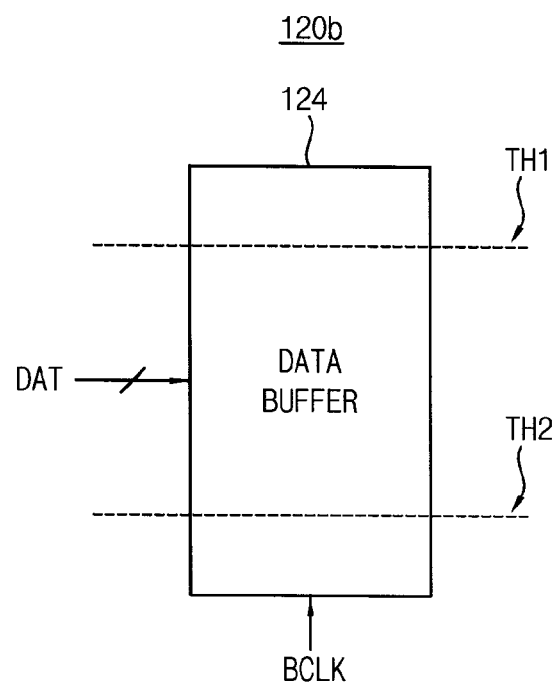

FIGS. 5A and 5B are block diagrams illustrating examples of a bus component included in the memory controller of FIG. 1.

Referring to FIG. 5A, a bus component 120a may include at least one request buffer 122. The request buffer 122 may handle (e.g., receive, store and/or output) the requests REQ based on the second clock signal BCLK. The requests REQ may be provided from the outside of the memory controller 100 in FIG. 1. In this case, the level signal LS may have a value corresponding to the amount of the requests REQ that are currently received by the request buffer 122. The first threshold value TH1 may be an upper request threshold value that corresponds to a maximum capacity of the request buffer 122 for handling the requests REQ. The second threshold value TH2 may be a lower request threshold value that corresponds to a minimum capacity of the request buffer 122 for handling the requests REQ.

Referring to FIG. 5B, a bus component 120b may include at least one data buffer 124. The data buffer 124 may handle (e.g., receive, store and/or output) the data DAT based on the second clock signal BCLK. The data DAT may be provided from the outside of the memory controller 100 in FIG. 1. In this case, the level signal LS may have a value corresponding to the amount of the data DAT that are currently received by the data buffer 124. The first threshold value TH1 may be an upper data threshold value that corresponds to a maximum capacity of the data buffer 124 for handling the data DAT. The second threshold value TH2 may be a lower data threshold value that corresponds to a minimum capacity of the data buffer 124 for handling the data DAT.

According to exemplary embodiments, the bus component 120 in FIG. 1 may include both at least one request buffer 122 shown in FIG. 5A and at least one data buffer 124 shown in FIG. 5B.

Figure 6:
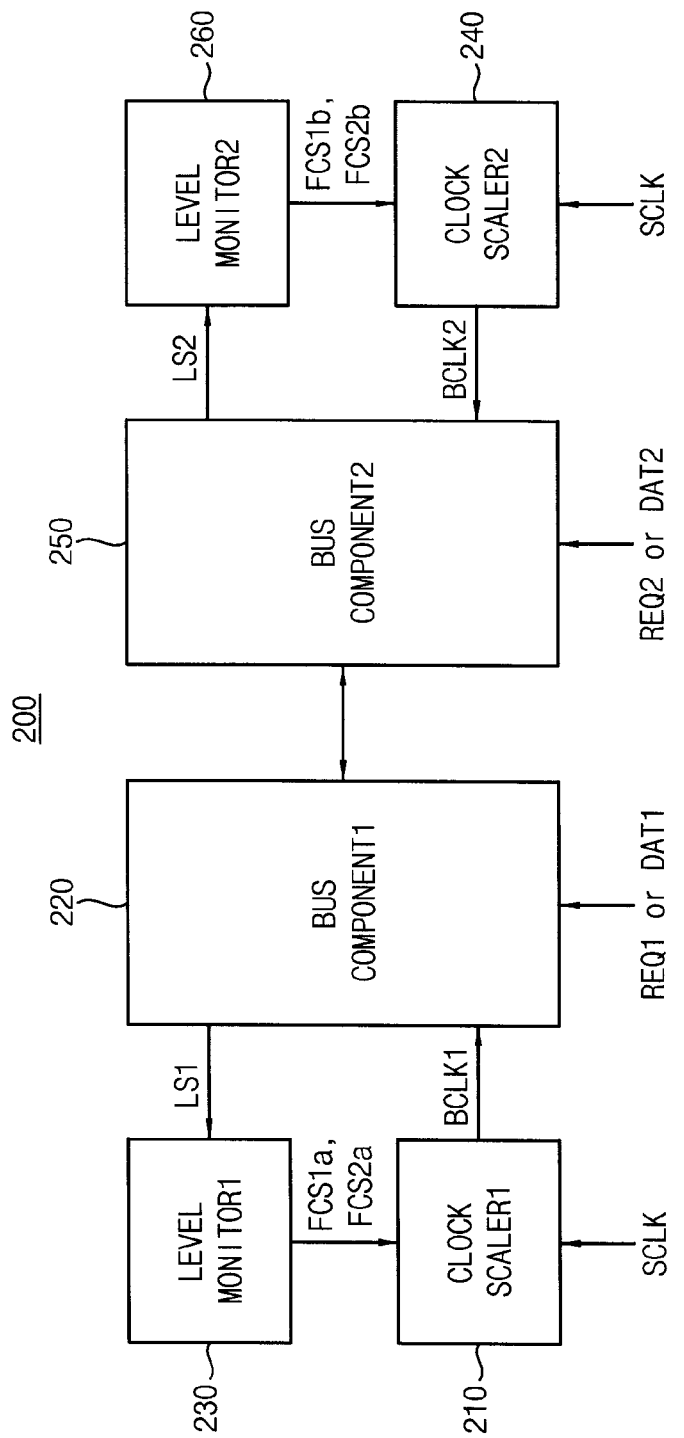
FIG. 6 is a block diagram illustrating a memory controller according to exemplary embodiments.

FIG. 6 is a block diagram illustrating a memory controller according to exemplary embodiments.

Referring to FIG. 6, a memory controller 200 may include a first clock scaler 210, a first bus component 220, a first level monitor 230, a second clock scaler 240, a second bus component 250, and a second level monitor 260.

As illustrated in FIG. 6, if the memory controller 200 includes two bus components 220 and 250, a configuration for controlling a frequency of a clock signal BCLK1 provided to the first bus component 220, may be separated from a configuration for controlling a frequency of a clock signal BCLK2 provided to the second bus component 250.

For example, the first clock scaler 210 may receive a first clock signal SCLK, a first frequency control signal FCS1a and a second frequency control signal FCS2a. The first clock scaler 210 may generate the second clock signal BCLK1 based on the first clock signal SCLK, the first frequency control signal FCS1a, and the second frequency control signal FCS2a. The frequency of the second clock signal BCLK1 may increase based on the first frequency control signal FCS1a, and the frequency of the second clock signal BCLK1 may decrease based on the second frequency control signal FCS2a. The first bus component 220 may receive, handle, or process requests REQ1 and/or data DAT1 based on the second clock signal BCLK1, and may generate a first level signal LS1 corresponding to a current operating state of the first bus component 220. The first level monitor 230 may generate the first frequency control signal FCS1a and the second frequency control signal FCS2a based on the first level signal LS1, a first threshold value, a second threshold value, a first reference time and a second reference time.

The second clock scaler 240 may receive the first clock signal SCLK, a third frequency control signal FCS1b, and a fourth frequency control signal FCS2b, and may generate the third clock signal BCLK2 based on the first clock signal SCLK, the third frequency control signal FCS1b, and the fourth frequency control signal FCS2b. The frequency of the third clock signal BCLK2 may increase based on the third frequency control signal FCS1b, and the frequency of the third clock signal BCLK2 may decrease based on the fourth frequency control signal FCS2b. The second bus component 250 may receive, handle, or process requests REQ2 and/or data DAT2 based on the third clock signal BCLK2. The second bus component 250 may generate a second level signal LS2 corresponding to a current operating state of the second bus component 250. The second level monitor 260 may generate the third frequency control signal FCS1b and the fourth frequency control signal FCS2b based on the second level signal LS2, a third threshold value, a fourth threshold value, a third reference time and a fourth reference time.

Each of the first and second clock scalers 210 and 240 in FIG. 6 may be substantially the same as the clock scaler 110 in FIG. 1. Each of the first and second bus components 220 and 250 in FIG. 6 may be substantially the same as the bus component 120 in FIG. 1. Each of the first and second level monitors 230 and 260 in FIG. 6 may be substantially the same as the level monitor 130 in FIG. 1.

Although not illustrated in FIG. 6, if the memory controller includes two bus components, the memory controller may include two level monitors and one clock scaler that is shared by two bus components, or may include one level monitor and one clock scaler that are shared by two bus components. According to exemplary embodiments, the memory controller may include a plurality of bus components, and the memory controller may include a level monitor and/or a clock scaler that are shared by at least a portion of the plurality of bus components.

Although the exemplary embodiments are described to control the frequency of the clock signal that is controlled by the level monitor and is provided to the bus component, the clock signal controlled by the level monitor may be provided to any element that is included in the memory controller and has traffics associated with data.

Figure 7:
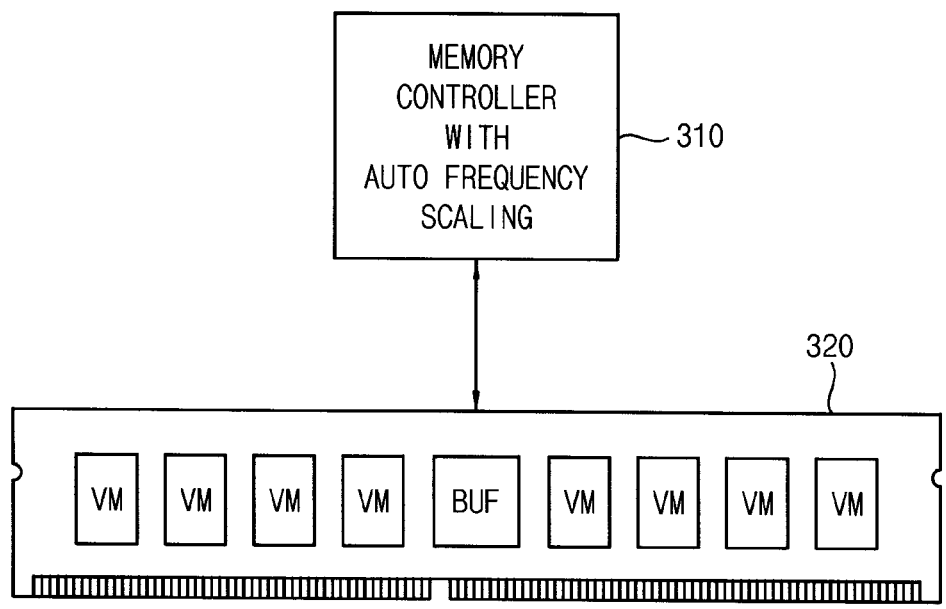
FIGS. 7 and 8 are block diagrams illustrating memory systems including the memory controller according to exemplary embodiments.
Figure 8:
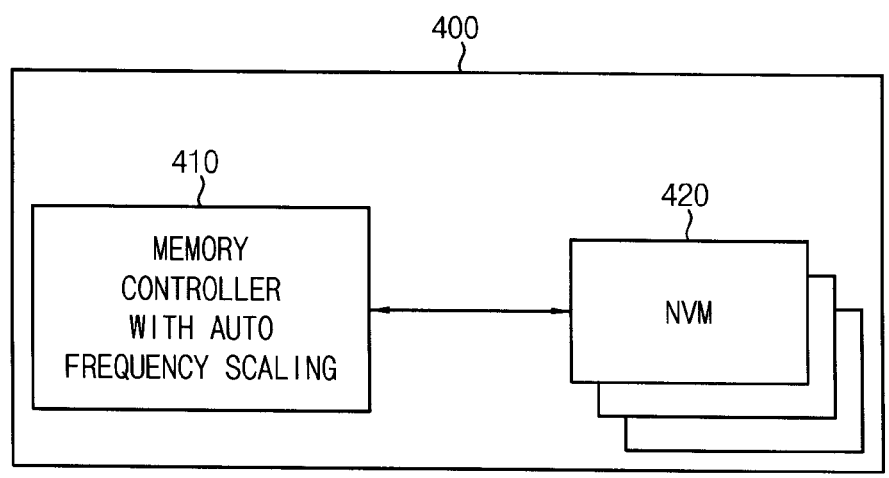

FIGS. 7 and 8 are block diagrams illustrating memory systems including the memory controller according to exemplary embodiments.

Referring to FIG. 7, a memory system 300 may include a memory controller 310 and a memory module 320.

The memory module 320 may include a buffer BUF and at least one memory device VM. According to exemplary embodiments, the memory module 320 may be an unbuffered dual in-line memory module (UDIMM), a registered dual in-line memory module (RDIMM), a fully buffered dual in-line memory module (FBDIMM), a load reduced dual in-line memory module (LRDIMM), etc.

The buffer BUF may receive a command, an address, and/or data from the memory controller 310 through a plurality of transmission lines, and may provide the command, the address, and/or the data to at least one memory device VM by buffering the command, the address, and/or the data. At least one memory device VM may store the data or may output stored data based on the command and the address. At least one memory device VM may be a volatile memory device, such as a DRAM, an SRAM, etc.

In some exemplary embodiments, data transmission lines between the buffer BUF and the memory device VM may be connected in a point-to-point topology. In some exemplary embodiments, command/address transmission lines between the buffer BUF and the memory device VM may be connected in a multi-drop topology, a daisy-chain topology, a fly-by daisy-chain topology, or the like. Since the buffer BUF buffers all of the command, the address and the data, the memory controller 310 may interface with the memory module 320 by driving only a load of the buffer BUF. Accordingly, the memory module 320 may include more memory devices VM and/or more memory ranks, and the memory system 300 may include more memory modules.

The memory controller 310 may control an operation of the memory module 320, e.g., an operation of at least one memory device VM. The memory controller 310 may be one of the memory controller 100 in FIG. 1 and the memory controller 200 in FIG. 6. For example, the memory controller 310 may operate based on the auto frequency scaling (AFS) scheme, and may include a level monitor for self-checking traffics of the memory controller 310 in the IP level. Accordingly, the memory controller 310 may efficiently generate a clock signal that is provided to an internal bus component and has an optimized frequency corresponding to a current operating state of the memory controller 310. The memory controller 310 may have relatively low power consumption.

Referring to FIG. 8, a memory system 400 may include a memory controller 410 and at least one memory device 420.

At least one memory device 420 may store data or may output stored data based on a command and an address. At least one memory device 420 may be a nonvolatile memory device, such as an EEPROM, a flash memory, a PRAM, an FRAM, an RRAM, an MRAM, an NFGM, a PoRAM, etc.

The memory controller 410 may control an operation of at least one memory device 420. The memory controller 410 may be one of the memory controller 100 in FIG. 1 and the memory controller 200 in FIG. 6. For example, the memory controller 410 may operate based on the AFS scheme and may include a level monitor for self-checking traffics of the memory controller 410 in the IP level. Accordingly, the memory controller 410 may efficiently generate a clock signal that is provided to an internal bus component and has an optimized frequency corresponding to a current operating state of the memory controller 410. The memory controller 410 may have relatively low power consumption.

Although not illustrated in FIG. 8, the memory system 400 may further include at least one volatile memory device that temporarily stores data transferred between the memory controller 410 and at least one memory device 420.

In some exemplary embodiments, the memory system 400 may be any storage device, such as a solid state drive (SSD), a memory card, etc. For example, the memory card may include a multimedia card (MMC), an embedded MMC (eMMC), a hybrid eMMC, a secure digital (SD) card, a micro-SD card, a memory stick, an identification (ID) card, a personal computer memory card international association (PCMCIA) card, a chip card, a universal serial bus (USB) card, a smart card, a compact flash (CF) card, etc.

In some exemplary embodiments, the SSD or the memory card may be attachable to a host (not illustrated), such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 9:
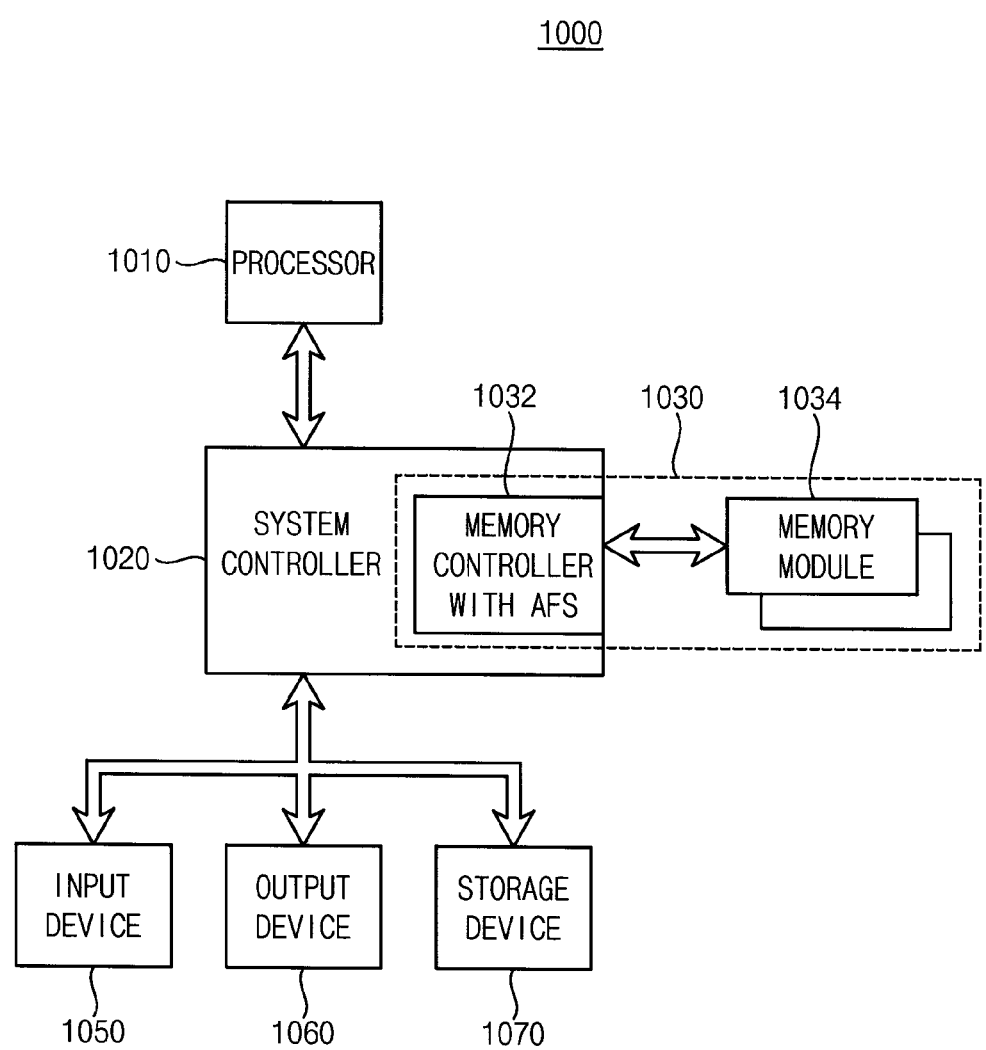
FIG. 9 is a block diagram illustrating a computing system including the memory controller according to exemplary embodiments.

FIG. 9 is a block diagram illustrating a computing system including the memory controller according to example embodiments.

Referring to FIG. 9, a computing system 1000 may include a processor 1010, a system controller 1020, and a memory system 1030. The computing system 1000 may further include an input device 1050, an output device 1060, and a storage device 1070.

The memory system 1030 may include at least one memory module 1034, and a memory controller 1032 for controlling the memory module 1034. The memory module 1034 may include at least one volatile memory device, such as a DRAM, an SRAM, etc., or may include at least one nonvolatile memory device, such as an EEPROM, a flash memory, a PRAM, an FRAM, an RRAM, an MRAM, an NFGM, a PoRAM, etc. The memory controller 1032 may be included in the system controller 1020.

The processor 1010 may perform various computing functions, such as executing specific software for performing specific calculations or tasks. For example, the processor 1010 may be a microprocessor, a central process unit (CPU), a digital signal processor, or the like. The processor 1010 may be connected to the system controller 1020 via a processor bus including an address bus, a control bus, and/or a data bus. The system controller 1020 may be connected to an expansion bus, such as a peripheral-component-interconnect (PCI) bus. The processor 1010 may control the input device 1050 such as a keyboard or a mouse, the output device 1060 such as a printer or a display device, and the storage device 1070 such as a hard disk drive or a compact disk read-only memory (CD-ROM).

The memory controller 1032 may be one of the memory controller 100 in FIG. 1 and the memory controller 200 in FIG. 6. For example, the memory controller 1032 may operate based on the AFS scheme, and may include a level monitor for self-checking traffics of the memory controller 1032 in the IP level. Accordingly, the memory controller 1032 may efficiently generate a clock signal that is provided to an internal bus component and has an optimized frequency corresponding to a current operating state of the memory controller 1032. The memory controller 1032 may have relatively low power consumption.

The computing system 1000 may be applicable to a desktop computer, a notebook, a computer, a work station, a handheld device, or the like.

Figure 10:
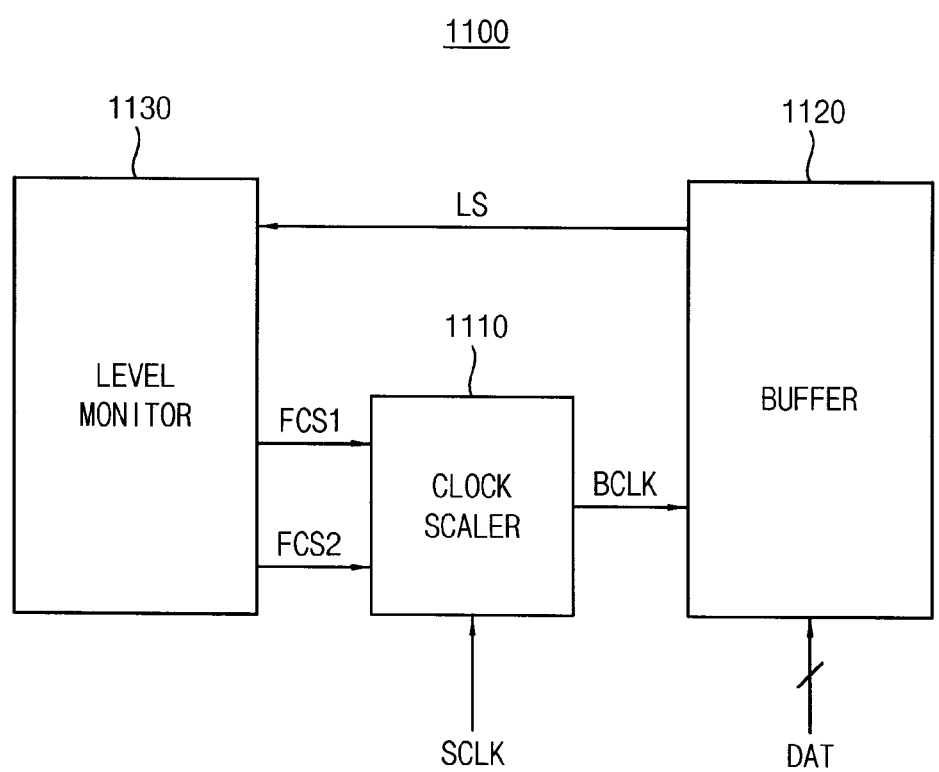
FIG. 10 is a block diagram illustrating an intellectual property (IP) according to exemplary embodiments.

FIG. 10 is a block diagram illustrating an intellectual property (IP) according to exemplary embodiments.

Referring to FIG. 10, an IP 1100 may include a clock scaler 1110, a buffer 1120, and a level monitor 1130.

The clock scaler 1110 may receive a first clock signal SCLK, a first frequency control signal FCS1, and a second frequency control signal FCS2, and may generate a second clock signal BCLK based on the first clock signal SCLK, the first frequency control signal FCS1, and the second frequency control signal FCS2. For example, the clock scaler 1110 may generate the second clock signal BCLK having an initial frequency by scaling the first clock signal SCLK, and may change a frequency of the second clock signal BCLK based on the first and second frequency control signals FCS1 and FCS2. The frequency of the second clock signal BCLK may increase based on the first frequency control signal FCS1, and the frequency of the second clock signal BCLK may decrease based on the second frequency control signal FCS2.

The buffer 1120 may operate based on the second clock signal BCLK, and may generate a level signal LS corresponding to a current operating state of the buffer 1120. For example, the buffer 1120 may receive, handle, or process data DAT that is provided from the outside of the IP 1100 based on the second clock signal BCLK. The level signal LS may have a value that corresponds to a capacity of the buffer 1120 for receiving, handling, or processing the data DAT in real time.

The level monitor 1130 may generate the first frequency control signal FCS1 and the second frequency control signal FCS2 based on the level signal LS, a first threshold value, a second threshold value, a first reference time, and a second reference time. For example, the level monitor 1130 may selectively activate one of the first and second frequency control signals FCS1 and FCS2, based on the first and second reference times and based on a result of comparing the level signal LS with the first and second threshold values.

The level monitor 1130 in FIG. 10 may have a configuration that is similar to the level monitor 130 in FIG. 2. The level monitor 1130 and the IP 1100 in FIG. 10 may operate based on the exemplary embodiments described above with reference to FIGS. 3 and 4.

In some exemplary embodiments, the IP 1100 may be any IP that receives, handles, or processes the data DAT provided from an outside of the IP 1100 and has traffics associated with the data DAT. For example, the IP 1100 may be a timing controller, a microprocessor, a CPU, or the like.

The IP 1100 according to exemplary embodiments may operate based on the AFS scheme. For example, the IP 1100 may include the level monitor 1130 for self-checking the traffics of the IP 1100 in the IP level. Accordingly, the IP 1100 may efficiently generate the second clock signal BCLK that has an optimized frequency corresponding to the current operating state of the IP 1100, and the IP 1100 may have relatively low power consumption.

Figure 11:
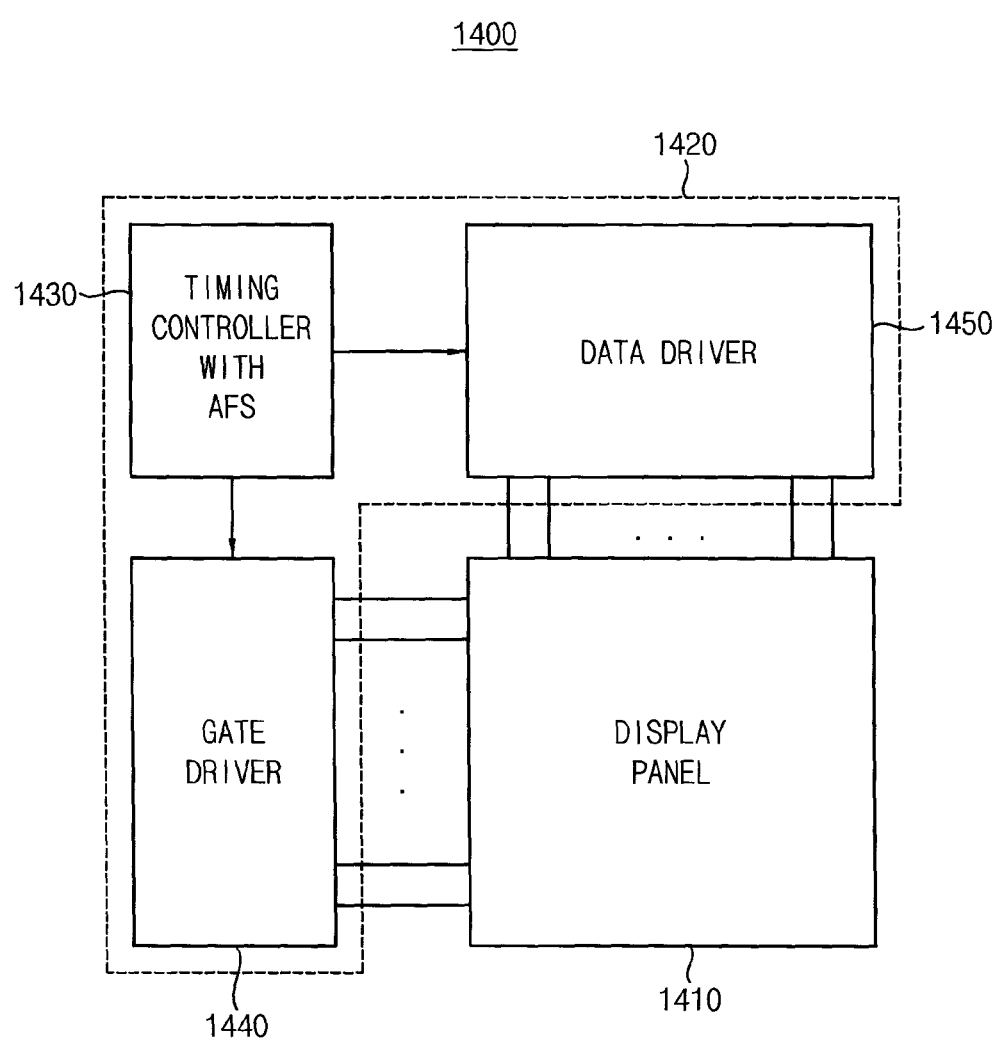
FIG. 11 is a block diagram illustrating a display system including the IP according to the exemplary embodiments.

FIG. 11 is a block diagram illustrating a display system including the IP according to exemplary embodiments.

Referring to FIG. 11, a display system 1400 may include a display panel 1410 and a display driver integrated circuit (DDI) 1420.

The display panel 1410 may include a plurality of gate lines and a plurality of data lines. The display panel 1410 may include a pixel array where a plurality of pixels are arranged in a matrix form. Each pixel may be defined as a corresponding region in which each of the gate lines and each of the data lines intersect. The display panel 1410 may include a liquid crystal display (LCD) panel, a light emitting diode (LED) display panel, an organic LED (OLED) display panel, a field emission display (FED) panel, etc.

The DDI 1420 may control an operation of the display panel 1410. The DDI 1420 may include a timing controller 1430, a gate driver 1440 and a data driver 1450.

The timing controller 1430 may receive an image data signal and a system control signal from an external device (e.g., a graphic processing unit (GPU)), and may generate a gate driver control signal, a data driver control signal, and data based on the image data signal and the system control signal. The gate driver 1440 may selectively enable the gate lines of the display panel 1410 based on the gate driver control signal in order to select a row of the pixel array. The data driver 1450 may apply a plurality of driving voltages to the data lines of the display panel 1410 based on the data driver control signal and the data. The display panel 1410 may be driven by the gate driver 1440 and the data driver 1450. The image corresponding to the image data signal may be displayed on the display panel 1410.

The timing controller 1430 may be implemented with a form of the IP according to example embodiments. For example, the timing controller 1430 may operate based on the AFS scheme and may include a level monitor for self-checking traffics of the timing controller 1430 in the IP level. Accordingly, the timing controller 1430 may efficiently generate a clock signal that is provided to an internal buffer and has an optimized frequency corresponding to a current operating state of the timing controller 1430. The timing controller 1430 may have relatively low power consumption.

Figure 12:
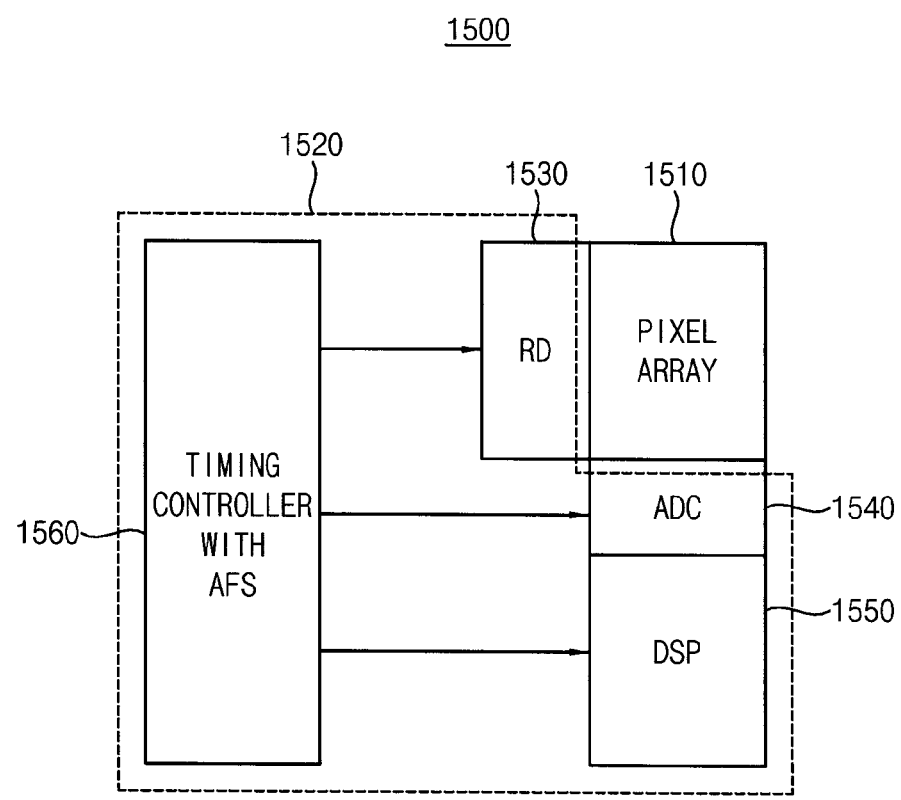
FIG. 12 is a block diagram illustrating an image sensor system including the IP according to the exemplary embodiments.

FIG. 12 is a block diagram illustrating an image sensor system including the IP according to exemplary embodiments.

Referring to FIG. 12, an image sensor system 1500 may include a pixel array 1510 and a signal processing unit 1520.

The pixel array 1510 may generate electric signals based on incident light. The pixel array 1510 may include a plurality of unit pixels that are arranged in a matrix form. For example, the pixel array 1510 may include a plurality of color pixels for providing color image information and/or a plurality of depth pixels for providing depth information, which indicates information about a distance (or a depth) of an object (not illustrated) from the image sensor system 1500. If the pixel array 1510 includes the plurality of depth pixels, the image sensor system 1500 may further include a light source module (not illustrated) that emits a transmission light focused on the object.

The signal processing unit 1520 may generate image data based on the electric signals. The signal processor 1520 may include a row driver 1530, an analog-to-digital converter (ADC) 1540, a digital signal processor (DSP) 1550, and a timing controller 1560.

The row driver 1530 may be connected with each row of the pixel array 1510. The row driver 1530 may generate driving signals to drive each row. The ADC 1540 may be connected with each column of the pixel array 1510. The ADC 1540 may convert analog signals that are output from the pixel array 1510 into digital signals. According to exemplary embodiments, the ADC 1540 may include a correlated double sampler (CDS) for extracting an effective signal component. In some exemplary embodiments, the CDS may perform an analog double sampling that extracts the effective signal component based on a difference between an analog reset signal including a reset component and an analog data signal including a signal component. In other exemplary embodiments, the CDS may perform a digital double sampling that converts the analog reset signal and the analog data signal into two digital signals and extracts the effective signal component based on a difference between the two digital signals. In still other example embodiments, the CDS may perform a dual correlated double sampling that performs both the analog double sampling and the digital double sampling. The DSP 1550 may receive the digital signals that are output from the ADC 1540, and may perform image data processing on the digital signals. For example, the DSP 1550 may perform image interpolation, color correction, white balance, gamma correction, color conversion, etc. The timing controller 1560 may control the row driving unit 1530, the ADC 1540, and the DSP 1550 by providing control signals, such as a clock signal, a timing control signal, or the like.

The timing controller 1560 may be implemented with a form of the IP according to example embodiments. For example, the timing controller 1560 may operate based on the AFS scheme and may include a level monitor for self-checking traffics of the timing controller 1560 in the IP level. Accordingly, the timing controller 1560 may efficiently generate a clock signal that is provided to an internal buffer and has an optimized frequency corresponding to a current operating state of the timing controller 1560. The timing controller 1560 may have relatively low power consumption.

In some exemplary embodiments, the DSP 1550 may be implemented with a form of the IP according to exemplary embodiments.

In some exemplary embodiments, if a mobile system includes an application processor (AP), a connectivity unit, a volatile memory device, a nonvolatile memory device, a user interface and a power supply, at least a part of the mobile system may be implemented with a form of the IP according to example embodiments. In other exemplary embodiments, if a computing system includes a processor, an input/output (I/O) hub, an I/O controller hub, at least one memory module and a graphic card, at least a part of the computing system may be implemented with a form of the IP according to example embodiments. According to exemplary embodiments, the mobile system, the computing system and/or components of the mobile and computing systems may be packaged in various forms, such as a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline IC (SOIC), a shrink small outline package (SSOP), a thin small outline package (TSOP), a system in package (SIP), a multi-chip package (MCP), a wafer-level fabricated package (WFP), or a wafer-level processed stack package (WSP).

The above described exemplary embodiments may be applied to any electronic device including the memory controller and any system including the IP. For example, the above described exemplary embodiments may be applied to various electronic systems, e.g., a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A memory controller comprising:
a clock scaler configured to receive a first clock signal, a first frequency control signal, and a second frequency control signal and configured to generate a second clock signal based on the first clock signal, the first frequency control signal, and the second frequency control signal, a frequency of the second clock signal being configured to increase based on the first frequency control signal, and the frequency of the second clock signal being configured to decrease based on the second frequency control signal;
a bus component configured to operate based on the second clock signal and to generate a level signal corresponding to a current operating state of the bus component; and
a level monitor configured to generate the first frequency control signal and the second frequency control signal based on the level signal, a result of comparison between a first reference time and a time period during which a value of the level signal is greater than a first threshold value, and a result of comparison between a second reference time and a time period during which the value of the level signal is less than a second threshold value.

2. The memory controller of claim 1, wherein the frequency of the second clock signal is controlled based on a feedback operation and an aging operation, the feedback operation indicating that the frequency of the second clock signal is changed by determining the current operating state of the bus component based on the level signal, and the aging operation indicating that the frequency of the second clock signal is changed after either the first reference time or the second reference time has elapsed.

3. The memory controller of claim 1, wherein the level monitor includes:
a storage;
a comparator configured to generate a first comparison signal by comparing the level signal with the first threshold value and to generate a second comparison signal by comparing the level signal with the second threshold value; and
at least one controller configured to selectively activate the first frequency control signal based on the first comparison signal and the first reference time, and configured to selectively activate the second frequency control signal based on the second comparison signal and the second reference time.

4. The memory controller of claim 3, wherein the comparator is configured to activate the first comparison signal when the value of the level signal is greater than the first threshold value, and configured to activate the second comparison signal when the value of the level signal is less than the second threshold value.

5. The memory controller of claim 4, wherein the at least one controller is configured to activate the first frequency control signal when a first activation time is longer than the first reference time, the first activation time indicating a time during which the first comparison signal is activated.

6. The memory controller of claim 5, wherein the at least one controller includes a timer configured to measure the first activation time.

7. The memory controller of claim 4, wherein the at least one controller is configured to activate the second frequency control signal when a second activation time is longer than the second reference time, the second activation time indicating a time during which the second comparison signal is activated.

8. The memory controller of claim 3, wherein the storage is configured to store the first threshold value, the second threshold value, the first reference time, and the second reference time.

9. The memory controller of claim 1, wherein the bus component includes at least one request buffer, and the level signal has a value corresponding to an amount of requests that are currently received by the at least one request buffer.

10. The memory controller of claim 1, wherein the bus component includes at least one data buffer, and the level signal has a value corresponding to an amount of data that are currently received by the at least one data buffer.

11. The memory controller of claim 1, wherein at least one from among the first threshold value, the second threshold value, the first reference time, and the second reference time is variable.

12. The memory controller of claim 1, wherein at least one from among the first threshold value, the second threshold value, the first reference time, and the second reference time is determined based on a user input signal.

13. The memory controller of claim 1, wherein at least one from among the first threshold value, the second threshold value, the first reference time, and the second reference time is adaptively changed based on a training operation.

14. The memory controller of claim 1, wherein the memory controller is a direct memory access (DMA) controller.

15. A memory system comprising:
at least one memory device configured to store data; and
a memory controller configured to control an operation of the at least one memory device, the memory controller comprising:
a clock scaler configured to receive a first clock signal, a first frequency control signal, and a second frequency control signal and to configured generate a second clock signal based on the first clock signal, the first frequency control signal, and the second frequency control signal, a frequency of the second clock signal being configured to increase based on the first frequency control signal, and the frequency of the second clock signal being configured to decrease based on the second frequency control signal;
a bus component configured to operate based on the second clock signal and to generate a level signal corresponding to a current operating state of the bus component; and
a level monitor configured to generate the first frequency control signal and the second frequency control signal based on the level signal, a first threshold value, a second threshold value, a first reference time, and a second reference time, the level monitor including a storage, a comparator, and at least one controller,
wherein the comparator of the level monitor is configured to generate a first comparison signal by comparing the level signal with the first threshold value and to generate a second comparison signal by comparing the level signal with the second threshold value, and the at least one controller is configured to selectively activate the first frequency control signal based on the first comparison signal and the first reference time, and configured to selectively activate the second frequency control signal based on the second comparison signal and the second reference time.

16. A method of operating a memory controller, the method comprising:

receiving a first clock signal by the memory controller;

generating by the memory controller a second clock signal based on the first clock signal;

operating a bus component included in the memory controller based on the second clock signal;

generating by the memory controller a first frequency control signal and a second frequency control signal based on a level signal, a result of comparison between a first reference time and a time period during which a value of the level signal is greater than a first threshold value, and a result of comparison between a second reference time and a time period during which the value of the level signal is less than a second threshold value, wherein the level signal corresponds to a current operating state of the bus component; and changing by the memory controller a frequency of the second clock signal based on the first frequency control signal and the second frequency control signal.

17. The method of claim 16, wherein the generating the first and second frequency control signals includes:

generating a first comparison signal by comparing the level signal with the first threshold value;

generating a second comparison signal by comparing the level signal with the second threshold value;

selectively activating the first frequency control signal based on the first comparison signal and the first reference time; and selectively activating the second frequency control signal based on the second comparison signal and the second reference time.

18. The method of claim 17, wherein the first comparison signal is activated when the value of the level signal is greater than the first threshold value, and the second comparison signal is activated when the value of the level signal is smaller than the second threshold value.

19. The method of claim 18, wherein the first frequency control signal is activated when a first activation time is longer than the first reference time, the first activation time indicating a time during which the first comparison signal is activated, and the second frequency control signal is activated when a second activation time is longer than the second reference time, the second activation time indicating a time during which the second comparison signal is activated.

20. The method of claim 19, wherein the frequency of the second clock signal increases when the first frequency control signal is activated, and the frequency of the second clock signal decreases when the second frequency control signal is activated.

* * * * *